United States Patent
Jia

(10) Patent No.: US 12,378,683 B2
(45) Date of Patent: Aug. 5, 2025

(54) SPUTTERING-BASED CATALYST DEPOSITION ON PARTICLES FOR MEMBRANE ELECTRODE ASSEMBLY (MEA) CATALYST LAYER

(71) Applicant: PLUG POWER INC., Latham, NY (US)

(72) Inventor: Qingying Jia, Latham, NY (US)

(73) Assignee: Plug Power Inc., Latham, NY (US)

( * ) Notice: Subject to any disclaimer, the term of this patent is extended or adjusted under 35 U.S.C. 154(b) by 95 days.

(21) Appl. No.: 18/047,350

(22) Filed: Oct. 18, 2022

(65) Prior Publication Data

US 2024/0124993 A1 Apr. 18, 2024

(51) Int. Cl.
| | |
|---|---|
| C23C 14/35 | (2006.01) |
| C23C 14/08 | (2006.01) |
| C23C 14/22 | (2006.01) |
| C25B 1/04 | (2021.01) |
| C25B 9/23 | (2021.01) |
| C25B 11/052 | (2021.01) |
| C25B 11/054 | (2021.01) |

(Continued)

(52) U.S. Cl.
CPC ............ *C25B 11/054* (2021.01); *C23C 14/08* (2013.01); *C23C 14/223* (2013.01); *C23C 14/35* (2013.01); *C25B 1/04* (2013.01); *C25B 9/23* (2021.01); *C25B 11/052* (2021.01); *C25B 11/069* (2021.01); *C25B 11/075* (2021.01)

(58) Field of Classification Search
None
See application file for complete search history.

(56) References Cited

U.S. PATENT DOCUMENTS

| | | | | |
|---|---|---|---|---|
| 2,280,649 | A | * 4/1942 | Kanhofer | ................. B01J 21/16 |
| | | | | 502/239 |
| 4,940,523 | A | * 7/1990 | Takeshima | .............. C23C 14/22 |
| | | | | 204/192.15 |
| 8,263,290 | B2 | 9/2012 | Lopez et al. | |

(Continued)

FOREIGN PATENT DOCUMENTS

| | | |
|---|---|---|
| EP | 3 222 752 A1 | 9/2017 |
| JP | 2021-113352 A | 8/2021 |
| JP | 2022-045885 A | 3/2022 |

OTHER PUBLICATIONS

Lewinski et al., "NSTF Advances for PEM Electrolysis—The Effect of Alloying on Activity of NSTF Electrolyzer Catalysts and Performance of NSTF Based PEM Electrolyzers", ECS Transactions, 69 (17) pp. 893-917 (Year: 2015).

(Continued)

*Primary Examiner* — Jason Berman
(74) *Attorney, Agent, or Firm* — Victor Cardona, Esq.; Kevin P. Radigan, Esq.; Heslin Rothenberg Farley & Mesiti P.C.

(57) ABSTRACT

Catalyst sputtering-based methods of facilitating forming a membrane electrode assembly (MEA) catalyst layer are provided. The methods include forming a catalyst ink, including obtaining a powder including a plurality of support particles, and depositing, via sputtering, a catalyst onto the plurality of support particles to form a supported catalyst for the catalyst ink. Further, the method includes providing the catalyst ink with the supported catalyst on a membrane to facilitate forming the catalyst layer of the membrane electrode assembly.

18 Claims, 4 Drawing Sheets

(51) Int. Cl.
*C25B 11/069* (2021.01)
*C25B 11/075* (2021.01)

(56) References Cited

U.S. PATENT DOCUMENTS

| | | | |
|---|---|---|---|
| 11,124,885 B2 | 9/2021 | Xu et al. | |
| 2002/0034675 A1* | 3/2002 | Starz | B22F 1/0545 |
| | | | 429/530 |
| 2006/0115711 A1 | 6/2006 | Kim et al. | |
| 2006/0254903 A1* | 11/2006 | Abe | C23C 14/223 |
| | | | 204/298.02 |
| 2009/0054230 A1* | 2/2009 | Veeraraghavan | C23C 14/0021 |
| | | | 427/580 |
| 2022/0023946 A1 | 1/2022 | Ballantine et al. | |
| 2022/0033982 A1 | 2/2022 | Park et al. | |

OTHER PUBLICATIONS

Zhao et al., "Highly Active, Durable Dispersed Iridium Nanocatalyst for PEM Water Electrolyzers", Journal of the Electrochemical Society, 165 (2) F82-89 (8 pages) (Year: 2018).
International Search Report & Written Opinion for PCT/US2023/071824, dated Nov. 29, 2023 (10 pages) (Year: 2023).

* cited by examiner

SPUTTERING-BASED CATALYST DEPOSITION ON PARTICLES FOR MEMBRANE ELECTRODE ASSEMBLY (MEA) CATALYST LAYER

BACKGROUND

The present invention relates generally to methods of forming membrane electrode assemblies of the type suitable for use in an electrolyzer, and relates more particularly to novel methods of forming a catalyst layer of a membrane electrode assembly for use in an electrolyzer.

Standard water electrolysis generates hydrogen and oxygen gases by applying a direct current in order to dissociate the water reactant. Alkaline and proton exchange membrane (PEM) electrolyzers are two major types of electrolyzers used for water electrolysis. PEM electrolysis is a particularly attractive method due to the lack of corrosive electrolytes, a small footprint, and the requirement of only deionized water as a reactant. PEM electrolysis also produces very pure hydrogen without the typical catalyst poisons that may be found in hydrogen produced from reformation. Despite these advantages of PEM electrolysis, current hydrogen production from PEM electrolysis only comprises a small fraction of the global hydrogen market, primarily due to its high cost of expensive components (e.g., membranes, catalysts, and bipolar plates) and the electricity consumption.

SUMMARY

Certain shortcomings of the prior art are overcome, and additional advantages are provided herein through the provision of a method, which includes forming a catalyst ink. Forming the catalyst ink includes obtaining a plurality of support particles, and depositing, via sputtering, a catalyst onto the plurality of support particles to form a supported catalyst for the catalyst ink. In addition, the method includes providing the catalyst ink with the supported catalyst on a membrane to facilitate forming a catalyst layer of a membrane electrode assembly.

By depositing, via sputtering, the catalyst onto the plurality of support particles, a lower catalyst content is achieved in the resultant catalyst layer of the membrane electrode assembly in comparison to other approaches to producing a catalyst layer. Further, by lowering content of the catalyst through deposition onto support particles, as disclosed herein, the resultant catalyst is more active than in prior approaches.

In one or more embodiments, the sputtering includes physical vapor deposition (PVD) sputtering of the catalyst onto the plurality of support particles to form the supported catalyst. In addition, in one or more implementations, the method includes shaking the plurality of support particles during the depositing, via sputtering, of the catalyst to facilitate dispersal of the sputtered catalyst onto the plurality of support particles. Advantageously, by depositing the catalyst via physical vapor deposition (PVD) sputtering of the catalyst onto the plurality of support particles, and shaking the plurality of support particles during the depositing, the sputtered catalyst is more uniformly dispersed onto the support particles, which facilitates enhanced surface area coverage of the sputtered catalyst on the support particles to form core-shell sputtered catalysts with lower catalyst content.

In one or more embodiments, the catalyst includes at least one catalyst material selected from the group consisting of iridium, iridium oxide, ruthenium, ruthenium oxide, platinum and platinum black.

In one example, the support particles of the plurality of support particles include at least one of metal oxide particles, doped metal oxide particles, metal boride particles, or doped metal boride particles. For instance, the metal oxide particles can include a metal oxide selected from the group consisting of titanium oxide, zirconium oxide, niobium oxide, tantalum oxide and tin oxide. Further, the doped metal oxide particles can include a dopant selected from the group consisting of tungsten, molybdenum, niobium, and fluorine. Further, the metal boride can include a metal boride selected from the group consisting of titanium boride, zirconium boride, and niobium boride.

In one or more implementations, the supported catalyst includes, at least in part, a hydrous oxide catalyst. By the supported catalyst being, at least in part, a hydrous oxide catalyst, a more active catalyst is achieved compared with approaches that result in, for instance, an anhydrous catalyst, such as a hydrous iridium oxide catalyst, or a crystalline iridium oxide catalyst.

In one example, the catalyst layer of the membrane electrode assembly is an anode catalyst layer of the membrane electrode assembly.

In another embodiment, a method is provided which includes forming an iridium-based (Ir-based) catalyst ink. Forming the Ir-based catalyst ink includes obtaining a powder comprising a plurality of support particles, including metal oxide particles, doped metal oxide particles, metal boride particles, or doped metal boride particles, and depositing, via sputtering, an iridium-based catalyst onto the plurality of support particles to form a supported Ir-based catalyst for the catalyst ink. Further, the method includes providing the catalyst ink with the supported Ir-based catalyst on a membrane to facilitate forming a catalyst layer of a membrane electrode assembly.

In a further embodiment, a method is provided which includes forming a catalyst ink. Forming the catalyst ink includes obtaining a powder comprising a plurality of support particles, and depositing, via sputtering, a catalyst onto the plurality of support particles to form a supported catalyst for the catalyst ink, where the catalyst ink includes a plurality of supported catalysts, each of the supported catalysts including a core and a shell, the core including a support particle of the plurality of support particles, and the shell including a hydrous oxide catalyst. Further, the method includes providing the catalyst ink on a membrane to facilitate forming an anode catalyst layer of a membrane electrode assembly.

In another embodiment, a support catalyst is provided including a core and a shell, where the core comprises a support particle and the shell comprises a hydrous oxide catalyst. In one embodiment, the hydrous oxide catalyst is a hydrous iridium oxide catalyst.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
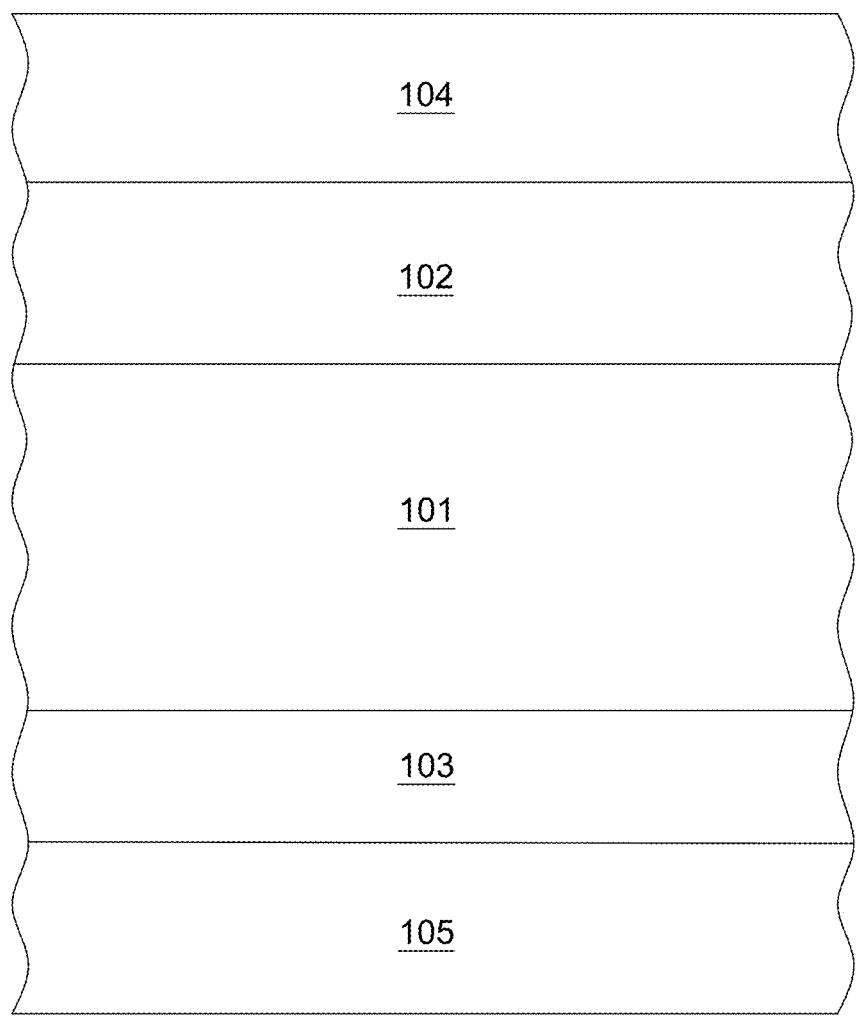
FIG. 1 is a schematic sectional view of one embodiment of a proton exchange membrane-based water electrolyzer cell, in accordance with one or more aspects of the present invention.

The accompanying figures, which are incorporated in and form a part of this specification, further illustrate the present invention and, together with this detailed description of the invention, serve to explain aspects of the present invention. Note in this regard that descriptions of well-known systems, processing techniques, etc., are omitted so as to not unnecessarily obscure the invention in detail. It should be understood, however, that the detailed description and this specific example(s), while indicating aspects of the invention, are given by way of illustration only, and not limitation. Various substitutions, modifications, additions, and/or other arrangements, within the spirit or scope of the underlying inventive concepts will be apparent to those skilled in the art from this disclosure. Note further that numerous inventive aspects or features are disclosed herein, and unless inconsistent, each disclosed aspect or feature is combinable with any other disclosed aspect or feature as desired for a particular application of the concepts disclosed.

In one or more implementations, an electrolysis cell can include a proton exchange membrane (PEM), an anode positioned along one face of the proton exchange membrane, and a cathode positioned along another face of the proton exchange membrane. To enhance electrolysis, one or more catalysts, or catalyst layers, can be provided both at the interface between the anode and the proton exchange membrane and at the interface between the cathode and the proton exchange membrane. This combination of proton exchange membrane, anode, cathode, and associated catalysts, is commonly referred to as a membrane electrode assembly (MEA).

In use, water is delivered to the anode, and an electric potential is applied across the two electrodes, causing the electrolyzed water molecules to be converted into protons, electrons and oxygen atoms. The protons migrate through the proton exchange membrane, and are reduced at the cathode to form molecular hydrogen. The oxygen atoms do not traverse the proton exchange membrane and, instead, form molecular oxygen at the anode. In implementations, a number of electrolysis cells can be assembled together to meet specified hydrogen or oxygen production requirements.

As noted, despite certain inherent advantages of PEM electrolysis, current hydrogen production from PEM electrolysis only comprises a small fraction of the global hydrogen market, primarily due to the high cost of expensive components (e.g., membranes, catalysts, and bipolar plates) and the cost of electricity consumption.

The present invention is directed, at least in part, to a sputtering-based deposition process of forming a catalyst coating, or supported catalyst, on a powder, which is highly active and durable, and which utilizes in practice a lower catalyst content to efficiently catalyze the oxygen evolution reaction (OER), thereby reducing component costs. In one or more embodiments, the catalyst is PVD-sputtered onto the support particles to form the supported catalyst as a shell over the core support particles. Further, in one or more embodiments, the supported catalyst comprises a hydrous oxide catalyst (such as a hydrous iridium oxide catalyst), which is a more active catalyst than other types of catalysts. In one implementation, the sputtered catalyst is an iridium-based catalyst (such as iridium or iridium oxide). By direct PVD-sputtering of catalyst material onto support particles to form the catalyst coating (or film) over the particles, less catalyst is used in the resultant catalyst layer of the membrane electrode assembly. The support particles (such as nanoscale support particles) and sputtering process are used to lower the catalyst loading within the resultant catalyst layers. Further, because the catalyst is highly active, the catalyst layer efficiently catalyzes the oxygen evolution reaction (OER), while having a reduced catalyst loading, and reduced electrolyzer cost.

Generally, in one embodiment, a method is disclosed herein which includes forming a catalyst ink. Forming the catalyst ink includes obtaining a powder comprising a plurality of support particles (such as a plurality of nanoscale support particles), and depositing, via sputtering, a catalyst onto the plurality of support particles to form a supported catalyst for the catalyst ink. Further, the method includes providing (e.g., printing, spraying, etc.) the catalyst ink with the supported catalyst on a membrane to facilitate forming a catalyst layer of the membrane electrode assembly.

By way of example, FIG. 1 depicts one embodiment of a PEM-based water electrolyzer cell, generally denoted 100, that includes sputter-deposited, particle-supported catalysts such as disclosed herein. In one or more embodiments, PEM-based water electrolyzer cell 100 includes a PEM 101, an anode catalyst layer 102, a cathode catalyst layer 103, and current collectors, including an anode electrode 104 and a cathode electrode 105. In one or more implementations, PEM 101 can be a solid polymer proton-exchange membrane that provides ionic conductivity between the cathode and anode catalyst layers. Examples of material suitable for use as PEM 101 include, but are not limited to, Nafion®, Aquivion®, FumaPEM®, and sulfonated hydrocarbons. Anode catalyst layer 102 and cathode catalyst layer 103 can be deposited on PEM 101 by a variety of approaches including, in one or more embodiments, wet-casting, dry-casting, hot-pressing, direct spraying, or printing of the respective catalyst layers onto PEM 101. In one or more implementations, one or more of the catalyst layers, such as anode catalyst layer 102, is printed or sprayed using catalyst ink onto the PEM. Cathode catalyst layer 103 can comprise standard cathode catalysts, such as platinum on carbon. In one or more embodiments, anode catalyst layer 102 can comprise a plurality of support particles, such as a plurality of nanoscale support particles, which are PVD-coated with a catalyst shell, defining core-shell catalysts. In one or more embodiments, the support particles can have a diameter in the range of about 5 nanometers to about 2 microns, and can be, for instance, a metal oxide of the type described herein, such as titanium oxide, zirconium oxide, molybdenum oxide, tantalum oxide, or tin oxide, or can include a doped metal oxide including a dopant of the type described, such as tungsten, molybdenum, niobium, or fluorine, or can be a metal boride, such as titanium boride, zirconium boride, and niobium boride, or can include a doped metal boride.

As noted, in one or more embodiments, sputtering, such as physical vapor deposition (PVD) sputtering is used to disperse a catalyst onto a plurality of support particles to form a supported catalyst. By physically sputtering the catalyst onto particles, such as nanoscale oxide support particles, to form core-shell sputtered catalysts, a lower catalyst content is achieved compared with other approaches to producing catalyst layers of a membrane electrode assembly, and the produced supported catalysts are highly active and durable. In one embodiment, the resultant supported catalysts obtained by processing such as disclosed herein can comprise, at least in part, hydrous oxide catalysts.

In one or more embodiments, the sputtered catalyst coats a majority of the surface area of the support particles, and can have a thickness of about 0.5 to 5.0 nanometers (for instance, about 2 nanometers). In one or more examples, the catalyst material can be of the type described above, such as iridium, iridium oxide, ruthenium, ruthenium oxide, platinum, or platinum black. Advantageously, by using PVD-sputtering such as disclosed herein, the desired catalyst is directly deposited by sputtering onto the outer surface of the support powder or support particles. In one or more embodiments, the resultant supported catalyst, that is, the catalyst material on the support particles, can be further dispersed in a binder or an ink. Examples of a binder that can be used include ionomers, such as Nafion®, Aquivion®, FumaPEM®, and sulfonated hydrocarbons. After anode catalyst layer 102 and cathode catalyst layer 103 have been provided on PEM 101, the current collectors can be secured to the anode and cathode catalyst layers on opposite sides of the PEM 101. In one implementation, the anode electrode 104 and cathode electrode 105 can be mechanically secured against the anode catalyst layer 102 and cathode catalyst layer 103, respectively. The current collectors supply the voltage to the PEM-based water electrolyzer cell via an externally connected circuit. In one embodiment, the PEM-based water electrolyzer cell can operate in a range of 1.6 V-2.0 V.

Figure 2:
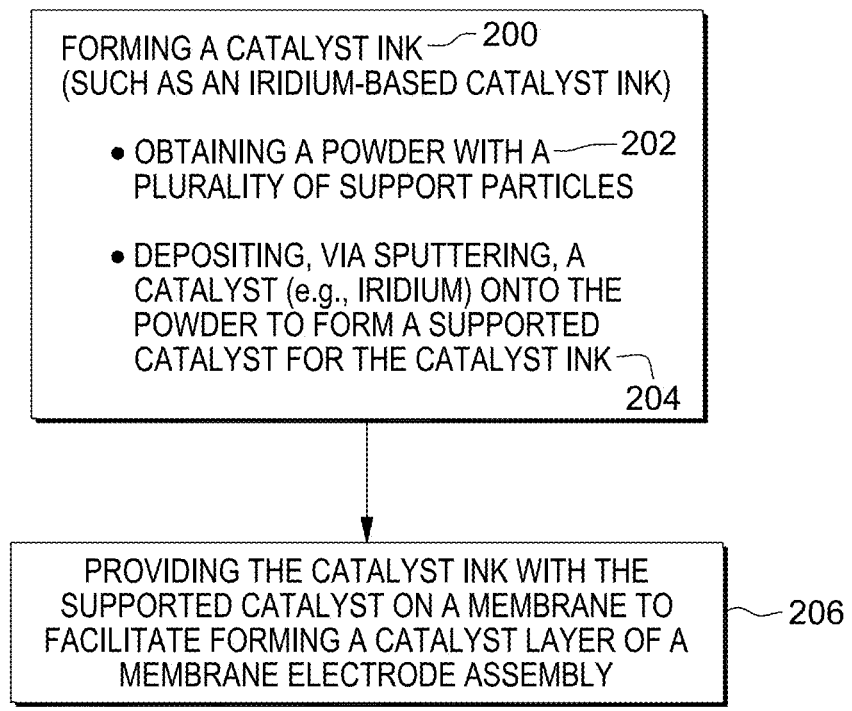
FIG. 2 depicts one embodiment of a sputtering-based method of depositing a catalyst material on particles for facilitating forming a membrane electrode assembly (MEA) catalyst layer, in accordance with one or more aspects of the present invention.

By way of example, FIG. 2 depicts one embodiment of a sputtering-based process which facilitates forming, in part, a catalyst layer of a membrane electrode assembly, in accordance with one or more aspects of the present invention. As illustrated in FIG. 2, the process can include forming a catalyst ink 200, such as an iridium-based catalyst ink. Forming the catalyst ink includes, in one or more embodiments, obtaining a powder comprising a plurality of support particles 202, such as a plurality of metal oxide particles or doped metal oxide particles. In accordance with one or more aspects, catalyst material is direct deposited, via sputtering, onto the powder particles to form a supported catalyst for the catalyst ink 204. This is accomplished, in one embodiment, using physical vapor deposition (PVD) sputtering of the catalyst onto the support particles. The result is a core-shell structure, where the core is defined by the support particle, and the shell by the deposited catalyst. Note that forming the catalyst ink can further include conventional process steps such as mixing ionomer solutions, the powder with the sputter-deposited catalyst and a dispersing solvent, such as water and alcohol.

As illustrated in FIG. 2, the method further includes providing the catalyst on a membrane to facilitate forming a catalyst layer of a membrane electrode assembly 206. Providing the catalyst ink on the membrane can include, for instance, printing or spraying the catalyst ink onto the membrane.

Physical vapor deposition (PVD) sputtering of material onto a surface is a well-known process in the semiconductor fabrication arts. A variety of PVD sputtering approaches can be used. For instance, the sputtering process can include: a neutral gas within the chamber being ionized by an external power supply, producing a glow discharge or plasma; a sputter system source (i.e., the cathode) is bombarded in a high vacuum by gas ions due to a potential drop acceleration in the sputtering system; atoms from the cathode or target are ejected by momentum transfer and diffused through the vacuum chamber, being deposited onto, for instance, the support particles being coated, forming a thin film or coating over the particles. A wide range of materials can be deposited using such a PVD sputter process.

Figure 3:
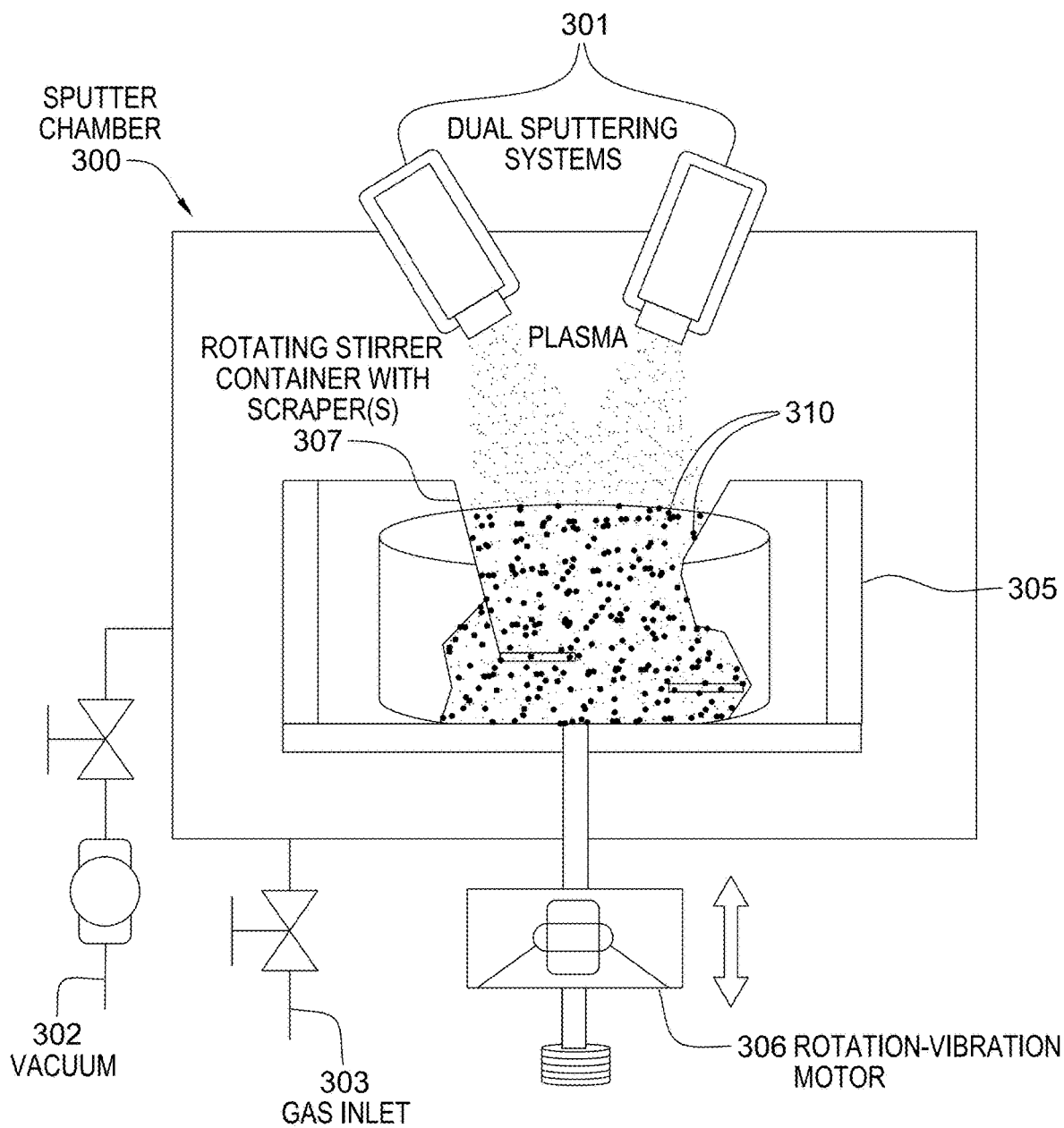
FIG. 3 depicts one system environment for sputtering a catalyst onto a plurality of support particles to form a supported catalyst, in accordance with one or more aspects of the present invention.

FIG. 3 depicts one example, where a sputter chamber 300, such as an arc-plasma evaporation chamber, includes (in one embodiment) dual-sputtering systems 301 for generating a plasma containing catalyst material to be directly deposited onto powder particles 310, such as discussed herein. The powder 310, in one or more embodiments, can include support particles in the range of about 5 nanometers to about 2 microns. In operation, powder 310 is placed into a container 305 within sputter chamber 300, with the amount of powder varying depending on the process. For instance, the amount of powder can be in the range of 10 g-10 kg in the sputter chamber, depending on the needs of the fluidized bed or container 305 in the sputter chamber. In one or more embodiments, a metal source, such as iridium metal, can be used as the target(s) in sputtering systems 301. (Note that in one or more other embodiments, a single sputtering system can be used to PVD-sputter the catalyst onto the support particles, or more than two sputtering systems can be used, if desired.)

During the sputtering process, a vacuum is established in one embodiment within sputter chamber 300 via a vacuum mechanism 302. Sputter chamber 300 can include a desired gas, such as argon gas, provided by a gas inlet 303. Further, in the embodiment depicted, container 305 is coupled to a rotation-vibration motor 306, and can contain rotating scrapers 307 within the container. The goal of rotation-vibration motor 306 and scrapers 307 is to ensure shaking or mixing of the support particles during sputter deposition of the catalyst to facilitate uniform dispersal and deposition of the catalyst material onto the support particles. During the sputtering process, a high-energy beam contacts the catalyst target to ionize the catalyst, and the catalyst ions are sputtered onto the powders that are being shaken (e.g., constantly shaken during the deposition process) in a fluidized bed or container 305 at high frequencies to ensure uniform deposition of the catalyst onto the surface of the powder. After the sputtering process, the particle-supported catalyst is then ready for ink preparation.

Figure 4:
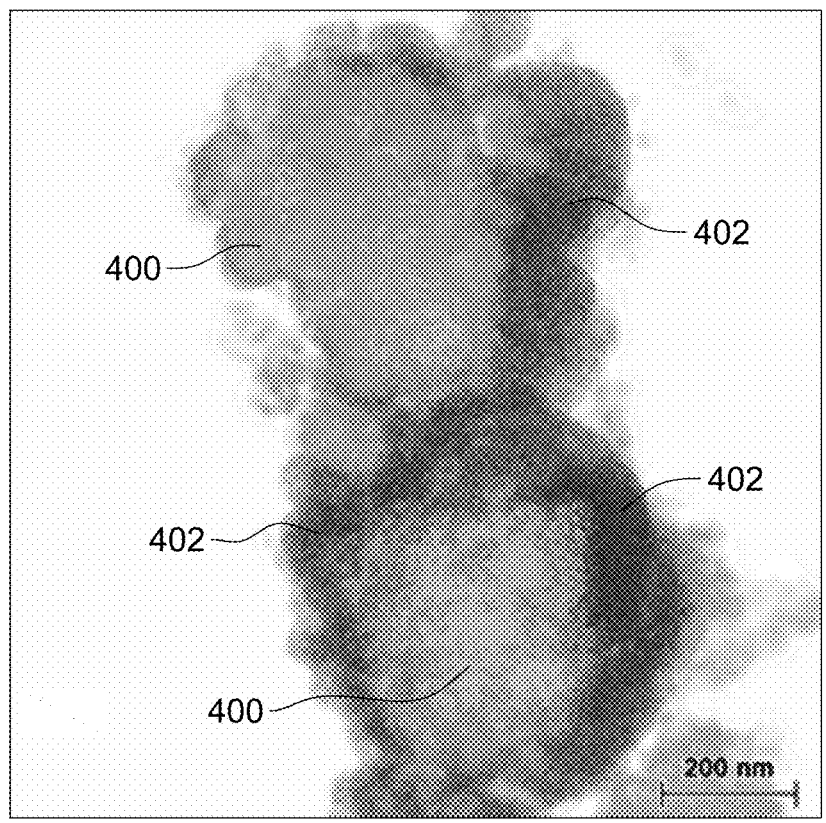
FIG. 4 is a TEM image of an example supported iridium-based catalyst on support particles, in accordance with one or more aspects of the present invention.

As a specific example, the catalyst can be an iridium-based (Ir-based) catalyst material being directly deposited by physical vapor deposition (PVD) sputtering onto support particles (of nanoscale size range) to form a coating on the support particles. In such a case, the support particles can be metal oxide particles, such as titanium oxide particles, or a doped metal oxide, such as tungsten-doped, titanium oxide, or a metal boride, such as titanium boride. Further, the iridium-based catalyst can be iridium or iridium oxide, by way of example. FIG. 4 depicts a transmission electron microscope (TEM) image of an iridium-based catalyst 402 supported on titanium oxide support particles 400, in accordance with one or more aspects of the present invention. In one or more embodiments, the deposited catalyst includes, at least in part, a hydrous oxide catalyst, such as $IrO_x \cdot nH_2O$ in the example discussed, which facilitates the catalyst being highly active, and efficiently catalyzing the oxygen evolution reaction (OER).

By way of further detail, in one or more embodiments, prior to sputtering, commercially available tungsten-doped titanium oxide nanoparticles, can be pre-dispersed and deagglomerated in $H_2O$ via ultrasonic agitation methods. The powders can then be dried, sieved, and loaded into the fluidized bed or container in the sputtering system. Vibrating the fluidized bed advantageously ensures uniform dispersion of the catalyst (e.g., iridium) on the support particles (e.g., W-doped $TiO_2$). The powders can be heated at different temperatures prior to the deposition process to facilitate direct depositing. In the sputtering process, one or more high-energy beams are used to ionize the catalyst metal (e.g., Jr metal). The generated ions in the sputter chamber are deposited onto the support particles. A variety of parameters, including substrate temperature, sputter time, and powder, can be tuned for a particular implementation. The powders can be collected after the sputtering process and directly tested as OER catalysts.

The present invention is also, in part, directed to a supported catalyst comprising a core and a shell, wherein the core comprises a support particle and the shell comprises a hydrous oxide catalyst. In one or more embodiments, the support particle is a metal oxide particle, a doped metal oxide particle, a metal boride particle, or a doped metal boride particle. A non-limiting example of a metal oxide particle is a titanium dioxide particle. A non-limiting example of a doped metal oxide particle is a tungsten-doped titanium dioxide particle. A non-limiting example of a metal boride particle is a titanium boride particle. In one or more embodiments, the hydrous oxide catalyst is hydrous $IrO_2$ and is formed by depositing the Jr metal onto the support particle via PVD sputtering. The hydrous oxide catalyst may result in a more active catalyst layer compared to a similar supported catalyst comprising an anhydrous oxide catalyst. The hydrous iridium oxide has a high amorphous morphology incorporated with structural water molecules (local Ir—$H_2O$ bonding) without long-range ordered Ir—O bonding networking structures.

In another aspect, the invention is directed to a catalyst ink comprising a plurality of supported catalysts, each of the supported catalysts comprising a core and a shell, wherein the core comprises a support particle and the shell comprises a hydrous oxide catalyst.

In another aspect, the invention is directed to a catalyst ink comprising a hydrous oxide catalyst, made by a method, the method comprising obtaining a powder comprising a plurality of support particles; and depositing, via sputtering, a catalyst onto the plurality of support particles to form a supported catalyst for the catalyst ink. In one or more embodiments, the catalyst is an iridium-based catalyst. The deposition of the catalyst, via sputtering, onto the plurality of support particles forms the shell comprising a hydrous oxide catalyst, as opposed to an anhydrous oxide catalyst.

In another aspect, the invention is directed to a membrane electrode assembly, comprising an anode, a catalyst ink, a proton exchange membrane, and a cathode, wherein the catalyst ink comprises a plurality of supported catalysts, each of the supported catalysts comprising a core and a shell, wherein the core comprises a support particle and the shell comprises a hydrous oxide catalyst.

In another aspect, the invention is directed to a water electrolysis system, comprising a membrane electrode assembly and an electric component for applying an electric potential causing the electrolyzed water molecules to be converted into protons, electrons, and oxygen atoms. In one or more embodiments, the membrane electrode assembly comprises an anode catalyst ink comprising a supported catalyst having a core-shell structure, the core-shell structure comprising a shell and a core, wherein the core comprises a plurality of support particles and the shell comprises a hydrous oxide catalyst.

Example

As a detailed example, deposition by sputtering can be performed by first pre-dispersing/deagglomerating the support particles (e.g., W-doped $TiO_2$ powder) in $H_2O$ via ultrasonic agitation methods. The powder can then be dried, sieved to −325 M, and loaded into the sputtering system. Then, the powder can be heated at, for instance 200° C. in the sputtering system, such as heated overnight. Sputter deposition of the catalyst film can proceed at room temperature for the balance of the run. In one example, approximately 17 g of nanoscale support powder can be provided within the system, with the process using argon gas or argon+20% $O_2$ or $H_2O$ within the chamber. In one implementation, the sputtering system is run at 500 watts for 5.5 hours (2.75 kW/hr total) for sputtering an iridium-based catalyst. The sputtering system can include a 3 inch Sierra cathode, and utilize DC magnetron deposition/no pulsing. Once the sputtering is complete, the powder is collected as a supported catalyst powder, ready for use, for instance, in catalyst ink preparation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A method comprising:
   forming a catalyst ink, including:
   obtaining a powder comprising a plurality of support particles;
   loading the powder into a fluidized bed in a container within a vacuum chamber;
   vibrating the container in a vacuum within the vacuum chamber, by applying an upward and downward force on the container, to generate upward and downward vibration action on support particles in the fluidized bed in the container within the vacuum chamber while depositing, via sputtering, a catalyst onto the plurality of support particles to provide uniform distribution of sputtered catalyst onto the plurality of support particles to form a supported catalyst for the catalyst ink, wherein the supported catalyst on the plurality of support particles comprises, at least in part, a hydrous oxide catalyst; and
   providing the catalyst ink with the supported catalyst on a membrane to facilitate forming a catalyst layer of a membrane electrode assembly.

2. The method of claim 1, wherein the sputtering comprises physical vapor deposition (PVD) sputtering of the catalyst onto the plurality of support particles to form the supported catalyst.

3. The method of claim 2, wherein the catalyst comprises at least one catalyst material selected from the group consisting of iridium, iridium oxide, ruthenium, ruthenium oxide, platinum and platinum black.

4. The method of claim 3, wherein support particles of the plurality of support particles comprise at least one of metal oxide particles, doped metal oxide particles, metal boride particles, or doped metal boride particles.

5. The method of claim 4, wherein the metal oxide particles comprise a metal oxide selected from the group consisting of titanium oxide, zirconium oxide, niobium oxide, tantalum oxide and tin oxide.

6. The method of claim 4, wherein the doped metal oxide particles comprise a dopant selected from the group consisting of tungsten, molybdenum, niobium and fluorine.

7. The method of claim 4, wherein the metal boride particles comprise a metal boride selected from the group consisting of titanium boride, zirconium boride, and niobium boride.

8. The method of claim 1, wherein the catalyst layer of the membrane electrode assembly is an anode catalyst layer of the membrane electrode assembly.

9. A method comprising:
   forming an iridium-based (Ir-based) catalyst ink, including:
   obtaining a powder comprising a plurality of support particles, including metal oxide particles, doped metal oxide particles, metal boride particles, or doped metal boride particles;
   loading the powder into a fluidized bed in a container within a vacuum chamber;
   vibrating the container in a vacuum within the vacuum chamber, by applying an upward and downward force on the container, to generate upward and downward vibration action on support particles in the fluidized bed in the container within the vacuum chamber while depositing, via sputtering, an iridium-based catalyst onto the plurality of support particles to provide uniform distribution of sputtered catalyst onto the plurality of support particles to form a supported Ir-based catalyst for the catalyst ink, wherein the supported Ir-based catalyst on the plurality of support particles comprises, at least in part, a hydrous oxide catalyst; and
   providing the catalyst ink with the supported Ir-based catalyst on a membrane to facilitate forming a catalyst layer of a membrane electrode assembly.

10. The method of claim 9, wherein the sputtering comprises physical vapor deposition (PVD) sputtering of the iridium-based catalyst onto the plurality of support particles to form the supported Ir-based catalyst.

11. The method of claim 10, wherein the metal oxide particles comprise a metal oxide selected from the group consisting of titanium oxide, zirconium oxide, niobium oxide, tantalum oxide and tin oxide.

12. The method of claim 10, wherein the doped metal oxide particles comprise a dopant selected from the group consisting of tungsten, molybdenum, niobium and fluorine.

13. The method of claim 9, wherein the metal boride particles comprise a metal boride selected from the group consisting of titanium boride, zirconium boride, and niobium boride.

14. A method comprising:
   forming a catalyst ink, including:
   obtaining a powder comprising a plurality of support particles;
   loading the powder into a fluidized bed in a container within a vacuum chamber;
   vibrating the container in a vacuum within the vacuum chamber, by applying an upward and downward force on the container, to generate upward and downward vibration action on support particles in the fluidized bed in the container within the vacuum chamber while depositing, via sputtering, a catalyst onto the plurality of support particles to provide uniform distribution of sputtered catalyst onto the plurality of support particles to form a supported catalyst for the catalyst ink, wherein the supported catalyst on the plurality of support particles comprises, at least in part, a hydrous oxide catalyst;
   providing the catalyst ink on a membrane to facilitate forming an anode catalyst layer of a membrane electrode assembly; and
   wherein the catalyst ink comprises a plurality of supported catalysts, each of the supported catalysts comprising a core and a shell, the core comprising a support particle of the plurality of support particles, and the shell comprising a hydrous oxide catalyst.

15. The method of claim 14, wherein the sputtering comprises physical vapor deposition (PVD) sputtering of the catalyst onto the plurality of support particles to form the supported catalyst.

16. The method of claim 15, wherein the plurality of support particles include metal oxide particles or doped metal oxide particles, the metal oxide particles comprising a metal oxide selected from the group consisting of titanium oxide, zirconium oxide, niobium oxide, tantalum oxide and tin oxide.

17. The method of claim 15, wherein the plurality of support particles include metal oxide particles or doped metal oxide particles, the doped metal oxide particles comprising a dopant selected from the group consisting of tungsten, molybdenum, niobium and fluorine.

18. The method of claim 14, wherein the plurality of support particles include metal boride particles or doped metal boride particles, the metal boride particles comprising a metal boride selected from the group consisting of titanium boride, zirconium boride, and niobium boride.

* * * * *